(12) United States Patent
Mitchell

(10) Patent No.: US 6,602,740 B1
(45) Date of Patent: Aug. 5, 2003

(54) ENCAPSULATION OF MICROELECTRONIC ASSEMBLIES

(75) Inventor: Craig S. Mitchell, Santa Clara, CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/718,945

(22) Filed: Nov. 22, 2000

Related U.S. Application Data

(60) Provisional application No. 60/167,351, filed on Nov. 24, 1999.

(51) Int. Cl.⁷ ............................................... H01L 21/44
(52) U.S. Cl. .................................... 438/127; 438/106
(58) Field of Search ................................. 438/106, 107, 438/108, 110, 112, 121, 124, 125, 126, 127

(56) References Cited

U.S. PATENT DOCUMENTS

| | | | | |
|---|---|---|---|---|
| 5,037,779 A | * | 8/1991 | Whalley et al. | 437/211 |
| 5,477,611 A | * | 12/1995 | Sweis et al. | 29/840 |
| 5,518,964 A | | 5/1996 | DiStefano et al. | 437/209 |
| 5,659,952 A | | 8/1997 | Kovac et al. | 29/840 |
| 5,766,987 A | | 6/1998 | Mitchell et al. | 438/126 |
| 5,776,796 A | | 7/1998 | DiStefano et al. | 438/106 |
| 5,798,286 A | * | 8/1998 | Faraci et al. | 438/113 |
| 5,801,441 A | | 9/1998 | DiStefano et al. | 257/696 |
| 5,834,339 A | | 11/1998 | DiStefano et al. | 438/125 |
| 5,859,472 A | | 1/1999 | DiStefano et al. | 257/674 |
| 6,046,076 A | | 4/2000 | Mitchell et al. | 438/127 |
| 6,049,972 A | | 4/2000 | Link et al. | 29/827 |
| 6,057,597 A | * | 5/2000 | Farnworth et al. | 257/710 |
| 6,080,605 A | | 6/2000 | DiStefano et al. | 438/126 |
| 6,187,613 B1 | * | 2/2001 | Wu et al. | 438/108 |
| 6,191,368 B1 | | 2/2001 | DiStefano et al. | 174/260 |
| 6,329,224 B1 | * | 12/2001 | Nguyen et al. | 438/127 |

* cited by examiner

*Primary Examiner*—Kamand Cuneo
*Assistant Examiner*—Scott B. Geyer
(74) *Attorney, Agent, or Firm*—Lerner, David, Littenberg, Krumholz & Mentlik, LLP

(57) ABSTRACT

A method of encapsulating microelectronic assemblies includes providing a substrate, securing at least one packaged chip atop the substrate, electrically interconnecting the at least one packaged chip and the substrate, and providing a dam atop the substrate, the dam surrounding the at least one packaged chip secured to the substrate. The method includes providing a cover layer over the dam and the at least one packaged chip secured atop the substrate, whereby the substrate, the dam and the cover layer define an enclosed space surrounding the at least one packaged chip. A curable liquid encapsulant is introduced into the enclosed space and cured to provide a compliant layer around the at least one packaged chip. The packaged chips may be electrically connected with the substrate using conductive leads or wires. Each packaged chip may include a semiconductor chip and a dielectric sheet electrically connected to the semiconductor chip. A porous layer, such as a plurality of compliant pads, may be disposed between the semiconductor chip and the dielectric sheet.

37 Claims, 8 Drawing Sheets

ENCAPSULATION OF MICROELECTRONIC ASSEMBLIES

CROSS-REFERENCE TO RELATED APPLICATIONS

The present application claims priority under 35 U.S.C. §120 of U.S. Provisional Application No. 60/167,351 filed Nov. 24, 1999 and is related to commonly assigned U.S. patent application Ser. No. 09/067,698, filed Apr. 28, 1998, entitled "Encapsulation of Microelectronic Assemblies." The disclosures of U.S. Provisional Application 60/167,351 and U.S. patent application Ser. No. 09/067,698 are hereby incorporated by reference herein.

BACKGROUND OF THE INVENTION

1. Field of the Invention

The present invention relates to art of making electronic devices and more specifically relates to methods of encapsulating microelectronic assemblies.

2. Description of the Related Art

When making microelectronic assemblies, such as semiconductor chip packages, it has been found desirable to provide an encapsulant between and/or around the different components of the microelectronic assemblies. It is theorized that using an encapsulant minimizes strain and stress on the electrical connections between the microelectronic assemblies and supporting circuitized substrates during operation of the assemblies. An encapsulant may also seal the components of the microelectronic assemblies against corrosion, as well as insure intimate contact between the encapsulant and the other elements of the microelectronic assembly.

Microelectronic assemblies such as semiconductor chip packages are typically encapsulated using curable liquid compositions. Such liquid compositions frequently cure upon exposure to elevated temperatures or light.

When encapsulating microelectronic assemblies, the liquid composition is generally dispensed or injected around or into the assembly. In many instances, a fixture is placed around the microelectronic assembly prior to dispensing the liquid composition. The fixture generally serves as a dam that ensures that the dispensed liquid composition flows around and between the components of the microelectronic assembly. After the liquid composition has been dispensed, the fixture may be placed in an oven to cure the liquid composition. Once the composition is cured, the fixture is removed from the oven and the one or more microelectronic assemblies are removed from the fixture. In order to improve the rate at which the microelectronic assemblies are manufactured, it may be desirable to remove encapsulated assemblies from the fixture before the curing step in order to increase the number of fixtures available for use on other batches of microelectronic assemblies.

Methods of using curable liquid compositions to encapsulate microelectronic assemblies are described in certain preferred embodiments of commonly assigned U.S. Pat. No. 5,659,652; U.S. Pat. No. 5,766,987; U.S. Pat. No. 5,776,796; U.S. patent application Ser. No. 09/067,698, filed Apr. 28, 1998; and U.S. patent application Ser. No. 08/610,610, filed Mar. 7, 1997, the disclosures of which are hereby incorporated by reference herein. Certain preferred embodiments of the above-identified patents and patent applications describe methods of making microelectronic assemblies including a semiconductor chip and a flexible dielectric sheet having terminals and flexible leads connected to the terminals. During assembly, contacts on the chip are electrically interconnected to terminals on the dielectric sheet by attaching tip ends of the leads to the chip contacts. In certain preferred embodiments, the electrical interconnection is made using flexible, electrically conductive leads having first or tip ends attached to chip contacts and second ends connected with terminals of the dielectric sheet. The assembly may also include a compliant layer such as a cured elastomer or gel disposed between the dielectric sheet and the chip to mechanically decouple the terminals of the sheet from the chip. As disclosed in certain preferred embodiments of the aforementioned patents and patent applications, such compliant layers can be made by providing a porous layer, such as a plurality of compliant pads, between the chip and the dielectric sheet, electrically connecting the terminals to contacts on the chip using conductive leads and then encapsulating the resulting assembly with a curable liquid composition so that the liquid composition penetrates through the porous layer and around the leads. Upon curing, the composition provides a compliant layer between the chip and the dielectric sheet. When making microelectronic assemblies of this nature, it is desirable to ensure that the encapsulant completely fills the porous layer, to provide a substantially void-free compliant layer in the final assembly.

There are many preferred methods for introducing and curing a curable liquid composition in microelectronic assemblies. For example, in certain preferred embodiments of the above-identified '987 patent, one or more cover layers may be applied over the top and bottom surfaces of one or more microelectronic assemblies, each assembly including at least one semiconductor chip electrically interconnected to at least a portion of a dielectric sheet. Typically, several microelectronic assemblies are provided in a side-by-side arrangement so that a single top cover layer overlies the top surfaces of the chips and a bottom cover layer underlies the bottom surface of the dielectric sheet. The top and bottom cover layers and the microelectronic assemblies may then be placed in a fixture. The top and bottom cover layers define a space therebetween. A vacuum is desirably drawn in the space between the top and bottom cover layers to remove air from the enclosed space and to ensure that the outside pressure is greater than the pressure between the cover layers. The fixture is then tilted so that a curable liquid encapsulant stored in a pocket of the fixture is able to flow into the space between the cover layers. The curable liquid composition is then cured while the microelectronic assemblies and cover layers remain in place in the fixture.

As described in certain preferred embodiments of commonly assigned U.S. Pat. No. 5,659,952, the disclosure of which is hereby incorporated by reference herein, and the aforementioned U.S. Pat. No. 5,776,796, the encapsulant may be applied using a needle or syringe that is positioned around the periphery of each microelectronic assembly. The needle, desirably connected to an encapsulant dispenser, is moved around the peripheries of the individual microelectronic assemblies so that the encapsulant flows into the space between each chip and a dielectric sheet. A cover layer may be used to close any bond windows in the dielectric sheet during this process. In other preferred embodiments for encapsulating microelectronic assemblies, as described in U.S. patent application Ser. No. 08/975,590 filed on Nov. 20, 1997, the disclosure of which is hereby incorporated by reference herein, the encapsulant dispensing operation is conducted inside a chamber, while the microelectronic assembly is under vacuum. When the vacuum is released, and the chamber is brought to atmospheric or superatmospheric pressure, the pressure forces the encapsulant into the porous layer between the chip and the dielectric sheet. Further, as described in U.S. patent application Ser. No. 09/012,590, filed Jan. 23, 1998, the disclosure of which is also incorporated by reference herein, it is convenient to use a frame to hold the dielectric sheet during the assembly procedures. The frame enables an operator to handle the dielectric sheet without directly contacting the portions of the sheet that comprise part of the final assembly. For example, while the dielectric sheet is mounted on the frame, an array of compliant pads used to form the porous layer may be applied to the dielectric sheet, the chips may be attached to the pads, and the terminals of the dielectric sheet may be electrically interconnected with the chips using flexible leads.

In spite of the above-mentioned advances in the art, there remains a need for improved methods for encapsulating microelectronic assemblies.

SUMMARY OF THE INVENTION

The present invention provides methods of encapsulating one or more microelectronic assemblies and is specifically directed to encapsulating microelectronic assemblies mounted to a substrate, such as a printed circuit board. In one preferred embodiment, the method includes providing a substrate having a top surface and securing at least one microelectronic assembly over the top surface of a substrate. A dam is provided over the top surface of the substrate, the dam surrounding the at least one microelectronic assembly mounted to the substrate. The substrate preferably includes a printed circuit board having one or more conductive pads on a top surface thereof, the conductive pads being used to form an electrical connection between the substrate and the microelectronic assembly.

Preferred microelectronic assemblies may include a semiconductor package including a semiconductor chip, a dielectric sheet having terminals on a bottom surface thereof, and leads electrically connecting chip contacts to the terminals of the dielectric sheet. The above-mentioned semiconductor package may include a porous layer disposed between the contact bearing face of the chip and the dielectric sheet. The porous layer may comprise a plurality of compliant pads having voids between the pads. Each package may also include a compliant material, such as a cured encapsulant, between the compliant pads and between the chip and the dielectric sheet.

A dam is preferably provided atop the first surface of the substrate and desirably surrounds the one or more microelectronic assemblies secured to the substrate. The dam may be a separate structure that is adhered to the top surface of the substrate. The dam may also be formed atop the substrate by dispensing a material into a mold or frame positioned atop the substrate and then curing the material dispensed into the mold to form the dam. The dam may also be integrally formed with the substrate, whereby the substrate and the dam are a single piece. The dam preferably includes any material capable of retaining a curable liquid encapsulant within a bounded area atop a substrate or circuit board until the liquid material can be cured into a solid. In highly preferred embodiments, the dam preferably includes an epoxy material. The curable liquid encapsulant is preferably cured using heat or light.

The method of encapsulating one or more microelectronic assemblies also desirably includes providing a cover layer over the dam and over the at least one microelectronic assembly mounted to the substrate. After the cover layer has been placed over the dam, the substrate, dam and cover layer desirably define an enclosed space that encompasses the at least one microelectronic assembly secured to the substrate. A curable liquid encapsulant may then be injected into the enclosed space and around the at least one microelectronic assembly. In certain preferred embodiments, the enclosed space may be evacuated, such as applying vacuum to remove any air in the enclosed space, prior to the step of injecting the liquid encapsulant. It is theorized that evacuating the enclosed space before introducing the curable encapsulant into the enclosed space minimizes the formation of air pockets or voids in the cured encapsulant layer.

Injecting the curable liquid encapsulant may include providing a dispenser, such as a needle in communication with the enclosed space and passing the liquid encapsulant into the enclosed space through the needle. The air in the enclosed space may be evacuated through the needle before the curable liquid encapsulant is introduced through the needle. The cover layer may include a hole between the external atmosphere and the enclosed space and the hollow needle may be advanced through the hole prior to passing the liquid encapsulant into the enclosed space. The above-mentioned step of evacuating the enclosed space may be performed by applying a vacuum through the hole in the cover layer or through the needle placed into the hole. The cover layer is preferably resilient so as to sealingly engage the needle at the hole when the needle is inserted into the hole.

In certain embodiments, the cover layer engages the back surface of the semiconductor chip so as to prevent any of the liquid encapsulant from coming into contact with the back surface of the chip when the encapsulant is introduced into the enclosed space. In other embodiments, a plate may be positioned over the back surface of the chips to prevent the cover layer from moving away from the chips as the encapsulant is introduced. Preventing contamination of the back surface of the chips is highly desirable. For example, if the back surface of a chip is free of contaminants, a thermally conductive layer and/or a heat sink, may be placed in communication with the back surface for removing heat from the one or more microelectronic assemblies. In other preferred embodiments, the cover layer is not in contact with the back surface of the microelectronic element so that the introduced curable liquid encapsulant may flow between the back surface of the microelectronic assembly and the cover layer. When the liquid encapsulant is cured, an insulating layer of encapsulant is formed atop the back surfaces of the one or more microelectronic assemblies.

In further embodiments, the microelectronic assembly is attached to the substrate by first securing a dielectric sheet having conductive terminals atop the substrate so that the terminals of the dielectric sheet are electrically interconnected with conductive pads on the substrate. Next, a semiconductor chip having a front contact bearing face is placed atop the dielectric sheet. The chips are electrically connected with the dielectric sheet using leads. A plurality of compliant pads may be provided between the chip and the dielectric sheet.

One or more of the microelectronic assemblies may have a porous layer between the microelectronic element and the dielectric sheet. The porous layer may include compliant pads or nubbins between the microelectronic element and the dielectric sheet. Preferably, the compliant pads are applied to the dielectric sheet before the microelectronic element is connected to the sheet. During the abovementioned step of injecting the liquid encapsulant, the liquid encapsulant preferably flows between the microelectronic element and the dielectric sheet and fills the voids between the compliant pads.

One or more platens may be placed atop the cover layer and/or below the substrate during the step of injecting the encapsulant. The platens may be held in place during the injecting the encapsulant step to control movement of the cover layer, the microelectronic assemblies and/or the substrate. In other preferred embodiments, one of the platens may be allowed to move in a controlled fashion away from one of the other platens during the injecting step so as to allow one or more leads interconnecting the microelectronic element with the dielectric sheet to move or flex during the injecting step.

In still further embodiments, the cover layer may be formed from a thermally conductive material such as a metallic sheet. After the encapsulant has been introduced and cured, a portion of the metallic sheet may remain attached to one or more of the microelectronic assemblies so that the metallic sheet may transfer heat from the assembly during operation thereof. In further embodiments, the thermally conductive layer may include one or more bores formed therein that face the substrate when the thermally conductive layer is provided atop the microelectronic assembly and the dam. Preferably, the bores are adapted for receiving the liquid encapsulant as it is injected between the cover layer and the substrate. The liquid encapsulant flows into the bores before the encapsulant is cured and provides protrusions or fingers comprising cured encapsulant that are effective for reliably adhering the conductive sheet to the cured encapsulant. Thus, the cured encapsulant in the bores provides additional gripping elements extending into the thermally conductive sheet or cover layer for providing enhanced adherence of the cover layer to the encapsulant.

Another preferred embodiment of the present invention provides a method of making a microelectronic assembly including attaching at least one microelectronic assembly to a substrate, providing a dam atop the substrate, wherein the dam surrounds the at least one microelectronic assembly and applying a cover layer over the dam and over the at least one microelectronic assembly attached to the substrate so as to define an enclosed space encompassing the at least one microelectronic assembly secured to the substrate. A curable liquid encapsulant is then injected into the enclosed space and around at least one microelectronic assembly and the encapsulant is cured. During the curing step, the dam and the cover layer confine the encapsulant so as to prevent the encapsulant from contacting a rear surface of the at least one microelectronic assembly attached to the substrate. In certain embodiments, the method also includes the step of evacuating the enclosed space between the cover layer and the dam and around the at least one microelectronic assembly prior to the step of injecting the liquid encapsulant. The above-mentioned curing steps may be performed at an elevated temperature or by applying light.

These and other preferred embodiments of the present invention will be described in more detail below.

DETAILED DESCRIPTION OF THE PREFERRED EMBODIMENTS

Figure 1:
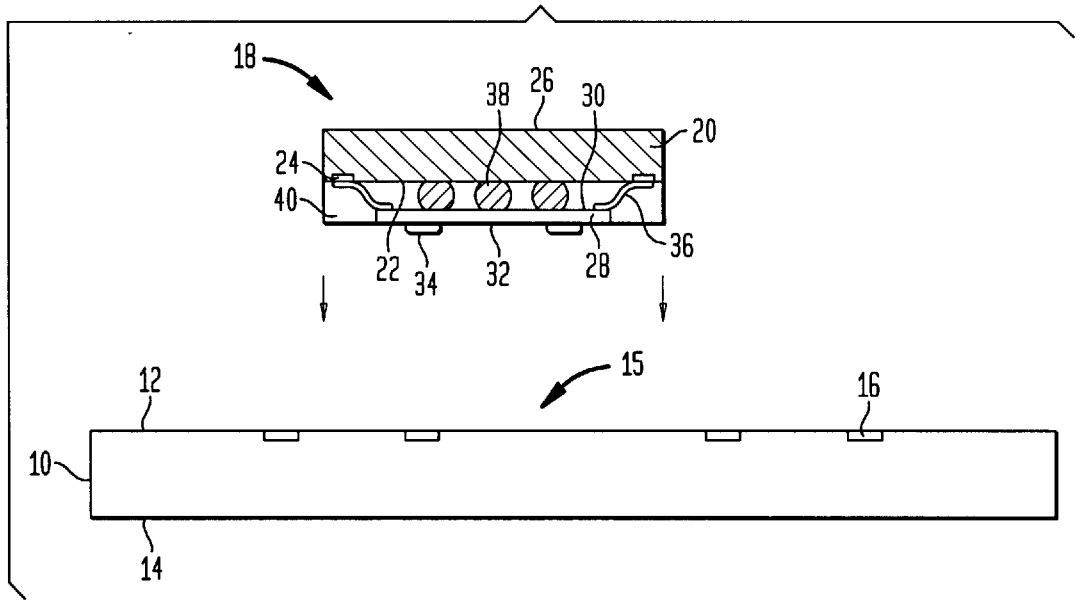
FIG. 1 shows a first step of a method of encapsulating microelectronic assemblies whereby at least one microelectronic assembly is secured atop to a substrate, in accordance with one preferred embodiment of the present invention.

FIGS. 1–4 show one preferred method of encapsulating microelectronic structures in accordance with certain preferred embodiments of the present invention. Referring to FIG. 1, a substrate 10 includes a top surface 12 and a bottom surface 14 remote therefrom. The substrate 10 includes a chip mounting area 15 having one or more conductive pads 16, the chip mounting area being adapted to receive one or more microelectronic assemblies 18 thereon. The microelectronic assembly 18 shown in FIG. 1 preferably includes a semiconductor chip 20 having a first surface 22 including contacts 24 and a rear surface 26 remote therefrom. The semiconductor chip 20 is electrically interconnected with a dielectric sheet 28 including a first surface 30 confronting the contact bearing surface 22 of the chip and a second surface 32 remote therefrom. The dielectric sheet includes one or more conductive terminals on the second surface 32 and conductive leads 36 electrically interconnecting the chip contacts 24 with the conductive terminals 34. The leads 36 may have many different shapes and/or designs such as those disclosed in commonly assigned U.S. Pat. No. 5,518,964, as well as in commonly assigned U.S. patent applications Ser. Nos. 08/927,601 and 08/712,855, the disclosures of which are hereby incorporated by reference herein. The microelectronic assembly 18 also includes resilient pads or nubbins 38 disposed between the chip 20 and the dielectric sheet 28 so that the dielectric sheet 28 can move relative to the chip during thermal cycling of the assembly. The microelectronic assembly 18 also includes a resilient layer 40 provided between the chip 20 and the dielectric sheet 28. The resilient layer 40 also fills the spaces between the resilient pads 38. The resilient pads 38 and the resilient layer 40 allow the terminals 34 of the dielectric sheet 28 to move relative to the chip 20 during thermal cycling.

Figure 2:
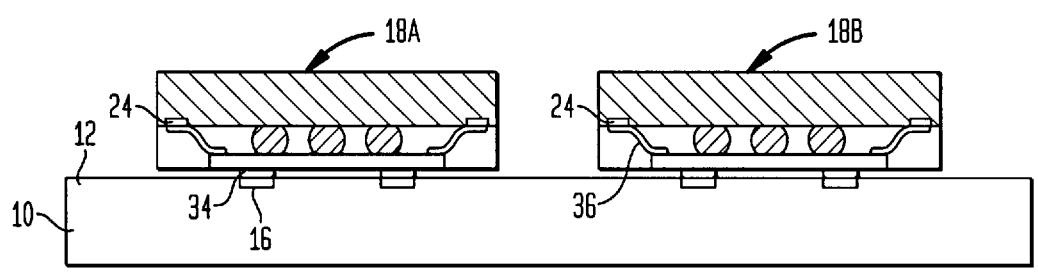
FIG. 2 shows the substrate of FIG. 1 having two microelectronic assemblies mounted thereto.

Referring to FIG. 2, two microelectronics assemblies 18A and 18B are mounted atop the first surface 12 of the substrate 10 and conductive terminals 34 are electrically interconnected with conductive pads 15 on the first surface 12 of substrate 10. In other preferred embodiments, one or more of the microelectronic assemblies may be a bare semiconductor chip mounted directly to the substrate using flip-chip bonding techniques or by mounting the back side of a semiconductor chip directly to the substrate and then using leads, such as flexible conductive leads 36, to electrically interconnect chip contacts 24 with the contact pads 16 on substrate 10.

Figure 3:
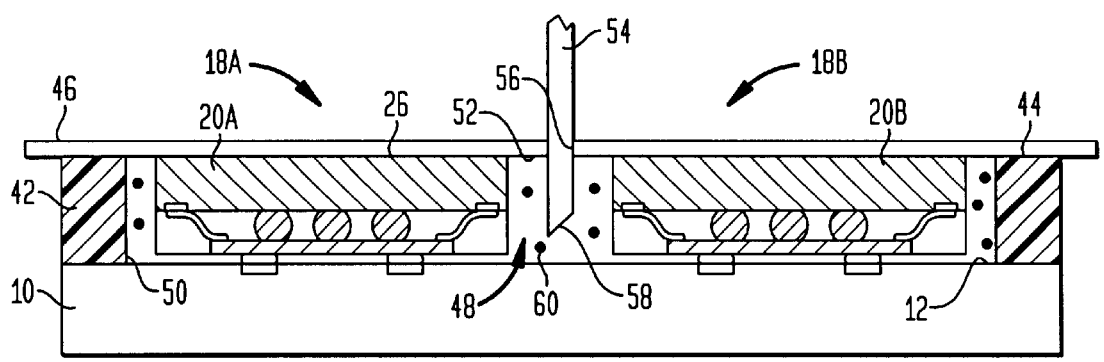
FIG. 3 shows the subassembly of FIG. 2 including a dam provided atop the substrate and a cover layer overlying the dam and the two microelectronic assemblies.

Referring to FIG. 3, a dam 42 is positioned atop the first surface of the substrate 10. The dam 42 may of an epoxy material deposited atop substrate 10. The dam 42 preferably surrounds the outer perimeter of the microelectronic assemblies 18A and 18B and has a top surface 44 that desirably lies in substantially the same plane as the back surface 26 of semiconductor chips 20. However, in other preferred embodiments, the top surface 44 of dam 42 and the back surfaces 26 of the chips 20 may lie in different planes. A cover layer 46 is desirably provided atop dam 42, the cover layer 46 preferably engaging the top surface 44 of dam 42 and the back surfaces 26 of semiconductor chips 20. After cover layers 46 has been put in place, top surface 12 of substrate 10, the interior side walls 50 of dam 42 and the bottom surface 52 of cover layer 46 define an enclosed space 48 encompassing the microelectronic assemblies 18A and 18B.

As shown in FIG. 3, a hollow needle 54 may be inserted through at least one opening 56 in cover layer 46 so that a tip end 58 of needle 54 is positioned within the enclosed space 48 between cover layer 46 and substrate 10. A vacuum may be drawn in the enclosed space to remove any air or other gases present within the enclosed space 48. In certain preferred embodiments, a source of low pressure for generating the vacuum is preferably connected to the needle 54 and the vacuum is drawn through the needle 54. The vacuum source may be a plant vacuum line or a dedicated vacuum pump and receiver of a conventional type. The vacuum source may be connected to the needle 54 through a control valve adapter to connect the needle 54 selectively either to the vacuum source or to the atmosphere, so that vacuum may be applied and relieved selectively.

In certain preferred embodiments, the needle may be a conventional hypodermic needle. In particular preferred embodiments the needle is a hypodermic needle that is relatively large such as a 10 gauge or 18 gauge needle. The needle is preferably connected to an encapsulant dispenser including a source of a curable liquid encapsulant and a controllable pressure source for applying pressure to the encapsulant for selectively forcing the encapsulant through the needle and into space 48.

After microelectronic assemblies 18A and 18B are mounted atop substrate 10, top cover layer 46 is positioned over the back surfaces 26 of chips 20A, 20B of the microelectronic assemblies 18A, 18B and over the top surface 44 of dam 42. Thus, cover layer 46 overlies the back surfaces 26 of microelectronic assemblies 18A, 18B, forming an air-tight seal over space 48. The cover layer 46 may be a polymeric sheet of the type commonly used as a solder mask layer and may have an adhesive on an underside thereof for adhering cover layer 46 to the back surfaces 26 of chips 20 and the top surface 44 of dam 42. The top cover layer 46 preferably has one or more holes 56 formed therein for receiving an end of needle 54. The holes 56 may be formed in the top cover layer after application of the cover layer atop dam 42, such as by using a photoimaging process or by laser ablation.

During an encapsulation process, air is preferably evacuated from enclosed space 48 between cover layer 46 and substrate 10. In one preferred embodiment, an end of needle 54 is positioned in hole 56 and the air present in 58 space 48 is removed by suction through needle 54. This action removes air from the space 48. After space 48 has been evacuated, the encapsulant dispenser (not shown) is actuated to force a curable liquid encapsulant through the needle 54 and out of the tip end 58 thereof. The flowing liquid encapsulant passes through the tip end 58 of the needle 54 and fills the enclosed space 48 between cover layer 46 and substrate 10. Although a wide variety of encapsulants may be employed, the encapsulant preferably is a liquid composition arranged to cure into a compliant dielectric elastomer or gel. The encapsulant may also be rigid. Preferred encapsulants include silicones, silicone elastomers, silicone gels, flexibilized epoxies and epoxies. Preferred methods for introducing a curable liquid encapsulant are disclosed in certain preferred embodiments of U.S. Pat. No. 5,801,441, the disclosure of which is hereby incorporated by reference herein. Preferred encapsulants also include curing agents that can be activated by exposing the curable material to heat.

Amend the paragraph beginning on page 21, line 9, and ending on line 18 as follows: In the particular embodiment shown in FIG. 10, chips 520 may have optically active elements at contact bearing surface 522. As used in this disclosure, the term "optically active element" refers to a portion of a chip that is capable of transposing light signals to electrical signals and electrical signals to light signals. One such example includes a photodetector adapted to produce electrical signals in response to light or a photo-emitting element such as a LED or laser adapted to emitted light in response to electrical signals. Thus, the optically active elements of the chips 520 may be adapted to detect or emit light within a particular wavelength. Cover layer 546 may be at least partially transparent so as to transmit light within the wavelength of light generated by or am received by the optically active elements.

In an uncured state, the curable liquid material desirably has some degree of thixotropy. In other words, the curable liquid material desirably has non-Newtonian, time-dependent flow characteristics such that once the material remains undisturbed for a brief period, substantial stress must be applied to the material to make it flow again. Thixotropic properties can be imparted to the curable liquid material by adding finely divided solid fillers such as silica to the gel composition. The use of thixotropic encapsulants is described in certain preferred embodiments of U.S. patent application Ser. No. 09/166,812 filed Oct. 6, 1998, the disclosure of which is hereby incorporated by reference herein. Typically, a pressure of about one hundred pounds per square inch or more, and typically about one hundred and fifty pounds per square inch is applied to the encapsulant. Such pressure levels force the encapsulant through the needle 54 and applies sufficient sheer stress to the material to break the thixotropic "set." Thus, while the encapsulant material is being introduced about the microelectronic assemblies, flows freely into the space 48 between cover layer 46 and substrate 10, and between and around each of the microelectronic assemblies 18A, 18B. After the encapsulant material space 48 has been completely filled with the curable liquid encapsulant, the pressure applied to the encapsulant in the dispenser is released and needle 54 is withdrawn from hole 56 in cover layer 46.

When needle 54 is removed from hole 56 in cover layer 46, the liquid encapsulant is confined within the enclosed space 48 by cover layer 46, dam 42 and substrate 10. The hole 56 in cover layer 46 could possibly provide some path for leakage of the liquid encapsulant, however, the thixotropic properties of the encapsulant cause it to set to a sufficient degree to resist leakage out from hole 56. Moreover, cover layer 46 is resilient so that it tends to spring back and at least partially seal hole 56 after needle 54 is removed. If additional insurance against encapsulant leakage is desired, the hole 56 left by needle 54 can be plugged by a disposable plug (not shown), such as a nail-shaped polymeric part, or can be covered with a piece of adhesive tape. In yet another alternative embodiment, the hole 56 left by needle 54 may be subjected to heating, such as by using a focused infrared lamp that results in intense local heating in order to cure the encapsulant at the hole and seal the hole temporally before the remainder of the encapsulant is cured. After removal of needle 54, the liquid encapsulant 60 is preferably cured such as by applying heat or light energy to the encapsulant.

Figure 4:
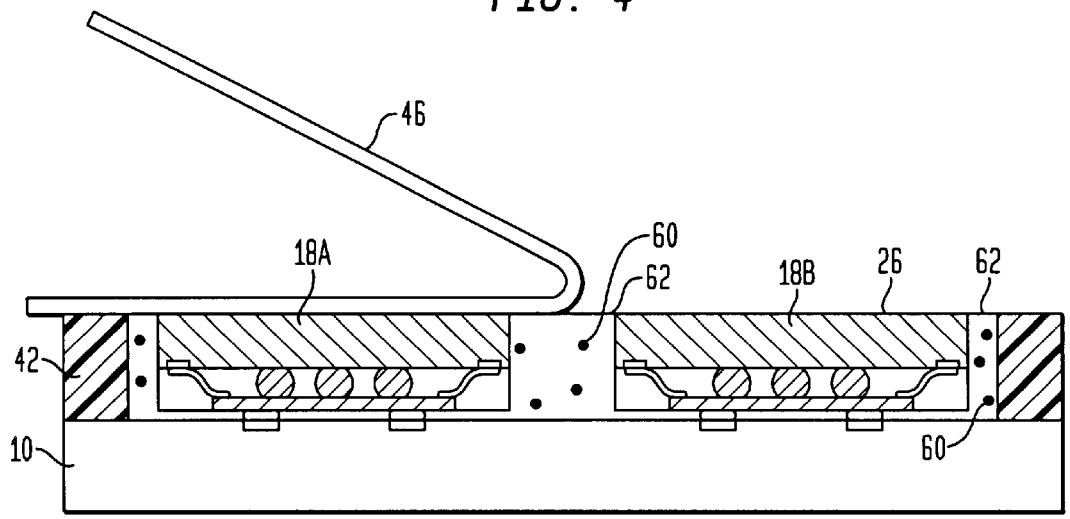
FIG. 4 shows the subassembly of FIG. 3 during a further processing step.

Referring to FIG. 4, after the encapsulant 60 is cured, the cover layer 46 may be removed so as to expose a top surface 62 of encapsulant 60 and the rear surfaces 26 of the microelectronic assemblies 18A, 18B. The cover layer 46 may be removed by peeling the cover layer from dam 42 and the encapsulant. In certain embodiments, dam 42 may be removed, however, in other embodiments it may be desirable to leave dam 42 in place atop substrate 10.

Figure 5:
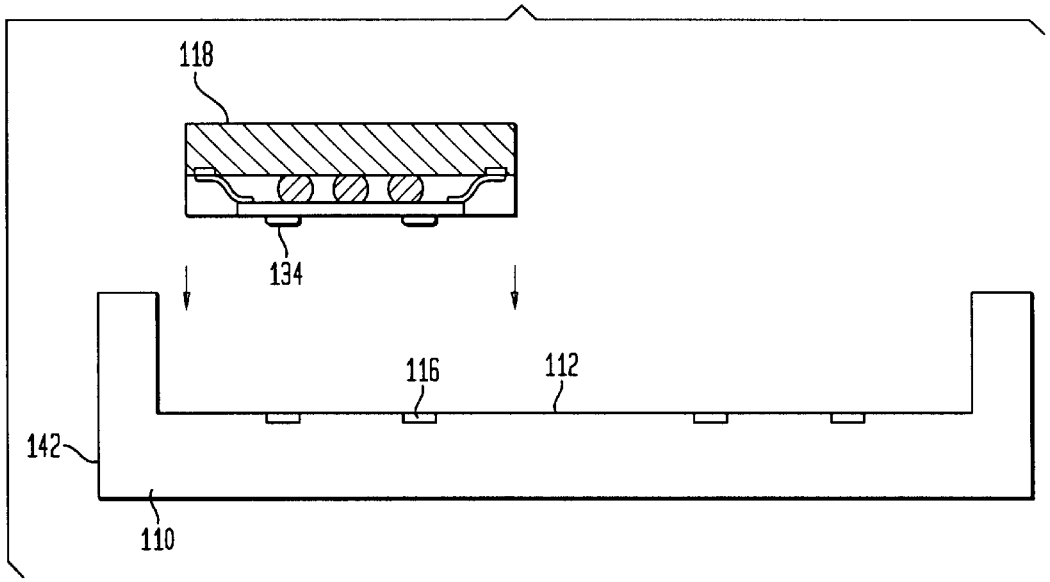
FIG. 5 shows a first step of a method of encapsulating microelectronic assemblies, in accordance with further preferred embodiments of the present invention.

FIG. 5 shows still another preferred embodiment of the present invention whereby dam 142 is integrally molded with substrate 110. In FIG. 5, dam 142 is formed at the outer perimeter of substrate 110, however, dam 142 may also be formed around only a portion of substrate 110. During assembly, one or more microelectronic assemblies 118, as shown and described above, may be mounted atop the top surface 112 of substrate 110 so that terminals 134 of microelectronic assembly 118 may be electrically interconnected with contact pads 116 of substrate 110.

Figure 6A:
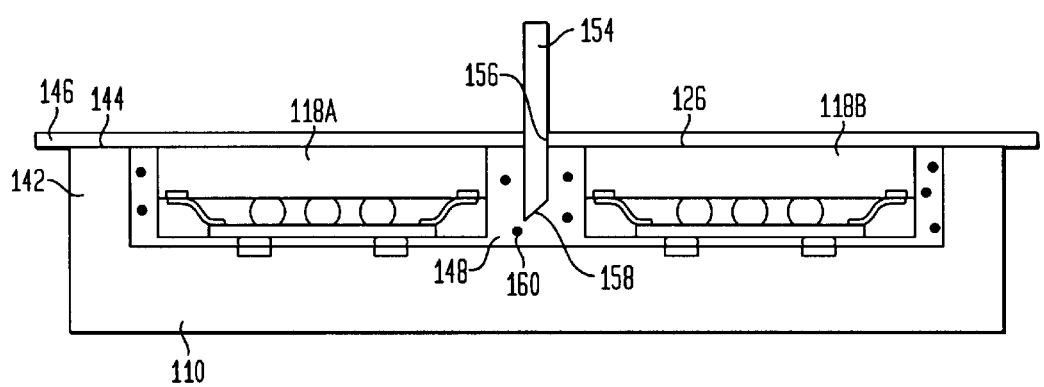
FIG. 6A shows the subassembly of FIG. 5 during a further step in the assembly process.
Figure 6B:
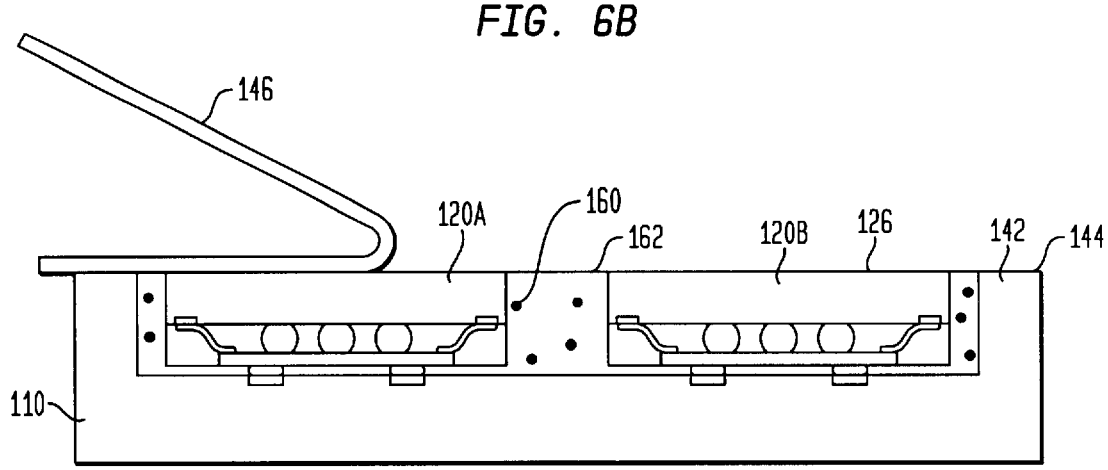
FIG. 6B shows the subassembly of FIG. 6A during a further step.

Referring to FIG. 6A, after the microelectronic assemblies 118 have been mounted to substrate 110 and electrically interconnected therewith, cover layer 146 is provided over the top edges 144 of dam 142 and the back surfaces 126 of microelectronic assemblies 18A, 18B. A needle 154 having tip end 158 may then be introduced into hole 156 in cover layer 146 for drawing air from enclosed space 148 and injecting a curable liquid encapsulant 160 into enclosed space 148. The curable liquid encapsulant 160 is retained within enclosed space 148 by cover layer 146, dam 142 and top surface 112 of substrate 110. The liquid encapsulant 160 is then cured, such as by applying heat, to provide a compliant layer surrounding microelectronic assemblies 118A, 188B. Referring to FIG. 6B, cover layer 146 may be removed to expose top surface 144 of dam 142, top surface 162 of encapsulant layer 160 and back surfaces 126 of chips 120A, 120B.

Figure 7:
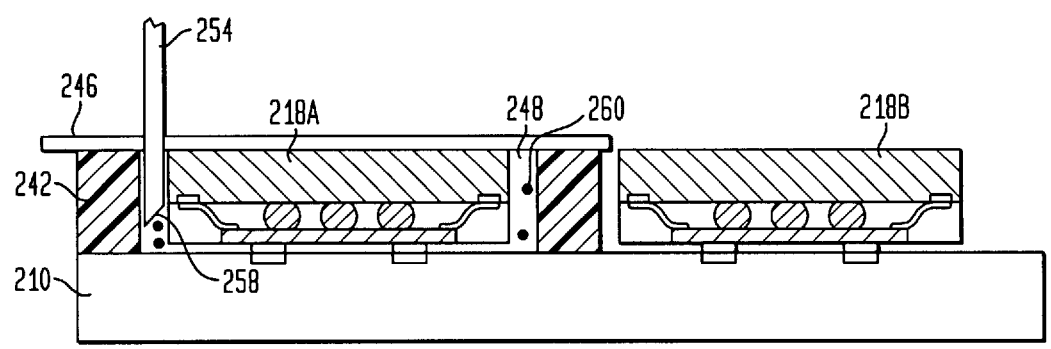
FIG. 7 shows a method of encapsulating one or more microelectronic assemblies, in accordance with further preferred embodiments of the present invention.

Referring to FIG. 7, in preferred certain embodiments, dam 242 may surround only one or more of the microelectronic assemblies 218A mounted to the substrate 210. In other words, some of the microelectronic assemblies secured to substrate may not be surrounded by dam 242. In FIG. 7, dam 242 surrounds a first microelectronic assembly 218A but does not surround a second microelectronic assembly 218B. Cover layer 246 is provided atop dam 242 so as to enclose microelectronic assembly 218A within an enclosed space 248 defined by cover layer 246, dam 242 and top surface 212 of substrate 210. As is evident in FIG. 7, cover layer 246 does not cover second microelectronic assembly 218B so that second microelectronic assembly 218B. After cover layer 246 is secured atop dam 242, a liquid encapsulant may be introduced into the enclosed space 248 through tip end 258 of needle 254. The encapsulant 160 may then be cured using the techniques described above.

Figure 8A:
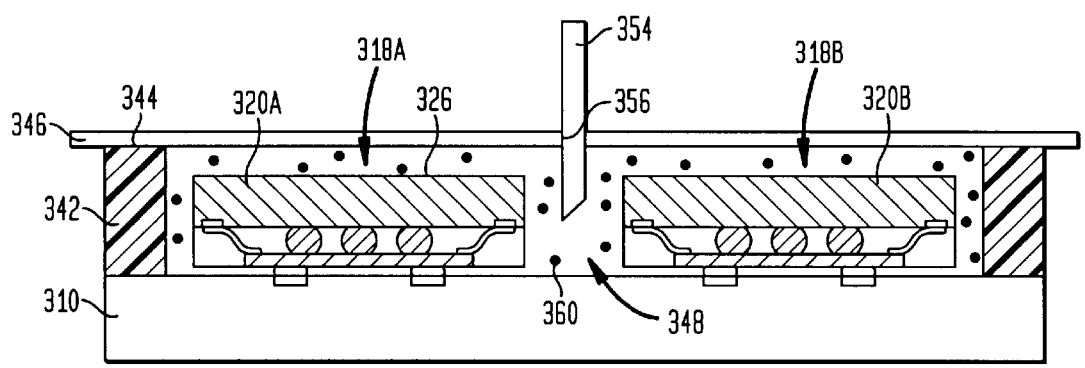
FIG. 8A shows a method of encapsulating one or more microelectronic assemblies, in accordance with still further preferred embodiments of the present invention.

FIG. 8A shows another embodiment of the present invention whereby dam 342 has an upper edge 344 that is higher than the back surfaces 326 of the microelectronic assemblies 318A, 318B attached to substrate 310. As a result, after cover layer 346 is adhered to the top edges 344 of dam 342, gap 364 is present between the back surfaces 326 of chips 302A, 320B and cover layer 346. A needle 354 is preferably inserted into hole 356 in cover layer 346 to introduce a curable liquid material 360 into enclosed space 348. In certain preferred embodiments, before introducing curable liquid material 360 into enclosed space 348, a vacuum is drawn through needle 354 to remove air from enclosed space 348. In other preferred embodiments, dam 342 may include a discharge valve that allows the air in enclosed space 348 to be discharged therefrom as encapsulant 360 is introduced into enclosed space 348 through needle 354.

Figure 8B:
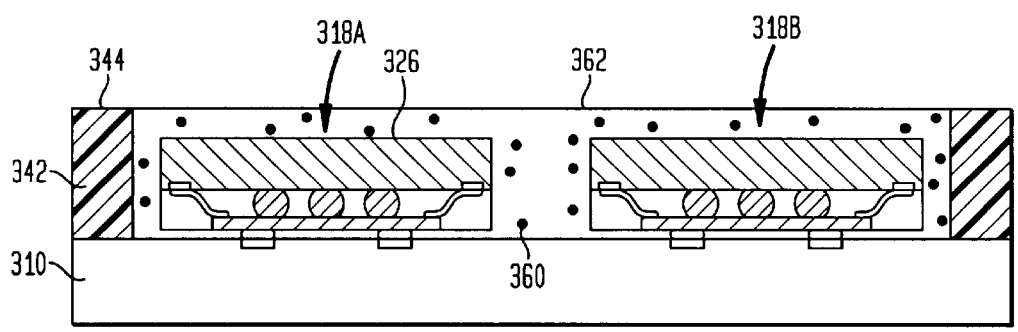
FIG. 8B shows the subassembly of FIG. 8A during a further step of the assembly process.

Referring to FIG. 8B, curable liquid material 360 is then cured to provide a compliant layer having top surface 362. The cover layer (not shown) is then removed so as to expose the top surface 344 of dam 342 and top surface 362 of compliant layer 360. A portion of compliant layer 360 overlies the back surfaces 362 of microelectronic assemblies 318A, 318B.

Figure 9A:
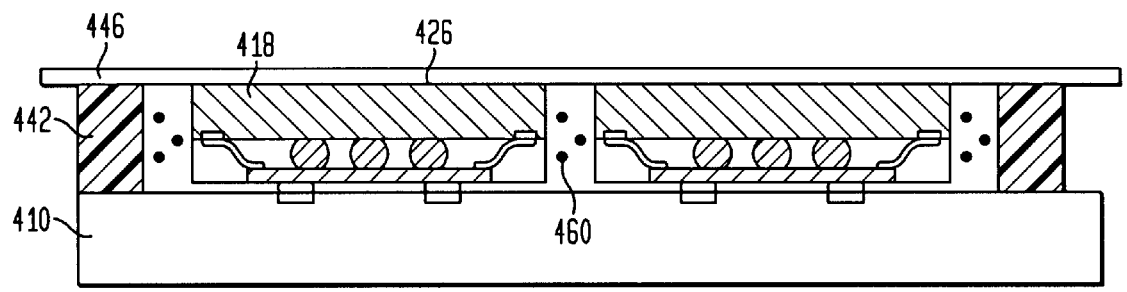
FIG. 9A shows a method of encapsulating one or more microelectronic assemblies, in accordance with yet further preferred embodiments of the present invention.
Figure 9B:
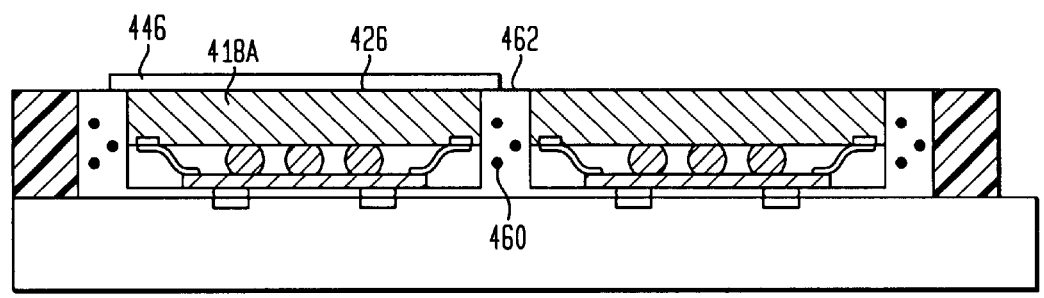
FIG. 9B shows the subassembly of FIG. 9A during a further step of the assembly process.

FIGS. 9A and 9B show another preferred embodiment of the present invention whereby at least a portion of cover layer 446 is left in place atop the back surface 426 of one or more microelectronic assemblies 418 after the liquid encapsulant 460 has been cured. Cover layer 446 preferably includes a thermally conductive material having heat conducting properties so that the heat generated by one or more microelectronic assembly 418A may be transferred to cover layer 446.

Figure 9C:
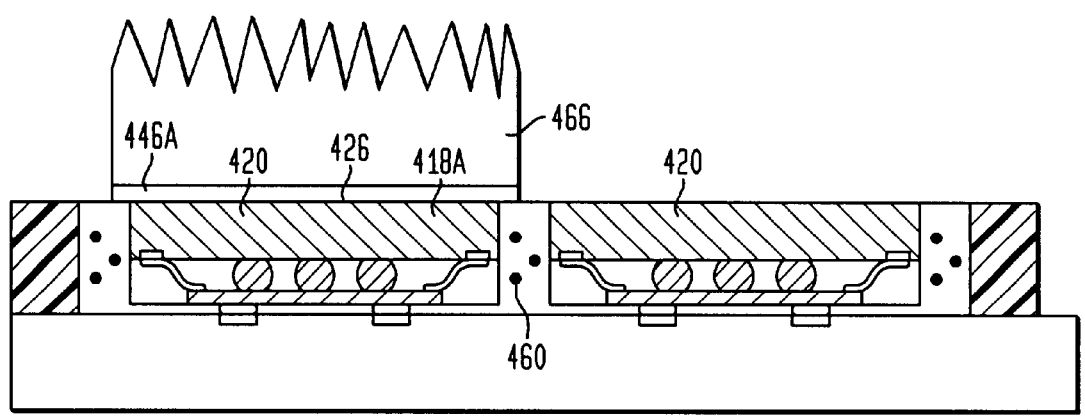
FIG. 9C shows the subassembly of FIG. 9B during a further step of the assembly process.

FIG. 9B shows the subassembly of FIG. 9A after a portion of cover layer 446 has been removed. In FIG. 9B, a portion 446A remains attached to back surface 426 of a first microelectronic assembly 418A. The peripheral edges of the cover layer 446A engages top surface 462 of compliant layer 460. As mentioned above, cover layer portion 446A is thermally conductive for transferring heat from first microelectronic assembly 418A to the air surrounding the package. As shown in FIG. 9C, in certain preferred embodiments, a heat sink 466 may be secured atop cover layer portion 446A for maximizing the amount of heat discharged through cover layer portion 446A. Heat sink 446 may be attached to cover layer portion 446A using a thermally conductive adhesive.

The thermally conductive cover layer portion 446A is preferably attached to back surface 426 of microelectronic assembly 418A using a thermally conductive adhesive, such as a silicone-silica composition or a metal-filled epoxy (not shown). The adhesive may be applied either on the cover layer portion 446A or on the back surfaces 426 of chips before application of cover layer 446.

Figure 10A:
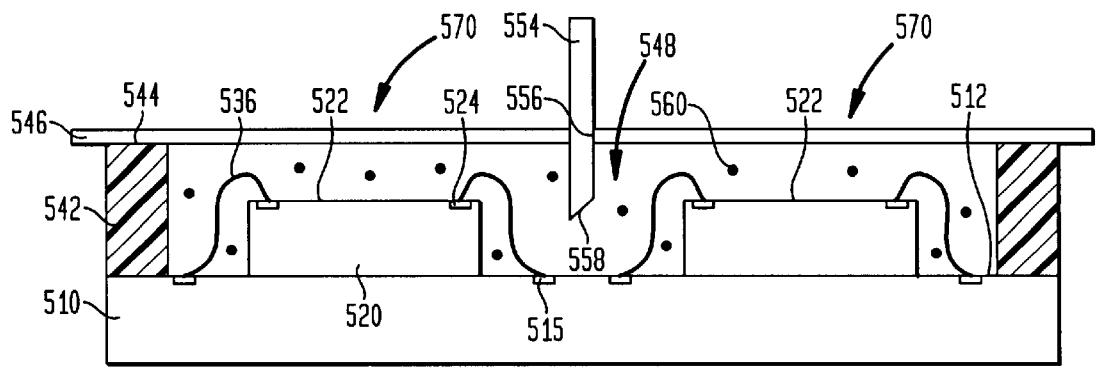
FIG. 10A shows a method of encapsulating one or more microelectronic assemblies, in accordance with still further preferred embodiments of the present invention.

As shown in FIG. 10A, in certain preferred embodiments, the orientation of the microelectronic assemblies 518 may be reversed so that the back surfaces 526 of chips 520 are connected to the top surface 512 of substrate 510, whereby the contact-bearing surface 522 of each chip 520 faces away from substrate 510. The contacts 524 on chips 520 are preferably connected to contact pads 516 on substrate 510 by conductive leads 536 such as wire bond leads. A cover layer 546 is preferably secured to top surface 544 of dam 542 with a central region 570 of cover layer 546 overlying the chips 520 secured to substrate 510. A needle 554 may be inserted into hole 556 of cover layer 546 and curable encapsulant material 560 introduced into the enclosed space 548 defined by cover layer 546, dam 542 and substrate 510. As mentioned above, the air in enclosed space 548 is preferably removed before encapsulant material 560 is introduced. The curable material 560 desirably surrounds wire bonds 536 and chips 520, and completely fills enclosed space 548.

In the particular embodiment shown in FIG. 10, chips 520 may have optically active elements at contact bearing surface 522. As used in this disclosure, the term "optically active element" refers to a portion of a chip that is capable of transposing light signals to electrical signals and electrical signals to light signals. One such example includes a photodetector adapted to produce electrical signals in response to light or a photoemitting element such as a LED or laser adapted to emitted light in response to electrical signals. Thus, the optically active elements of the chips 520 may be adapted to detect or emit light within a particular wavelength. Cover layer 446 may be at least partially transparent so as to transmit light within the wavelength of light generated by or received by the optically active elements.

In the foregoing processes, the microelectronic assemblies are individually sealed prior to encapsulation so that the encapsulant forms an outer coating or covering on each assembly but does not enter the assembly itself. However, the present invention may be utilized with assemblies whereby the encapsulant flows between the components of the individual assemblies and forms part of the compliant layer.

Figure 10B:
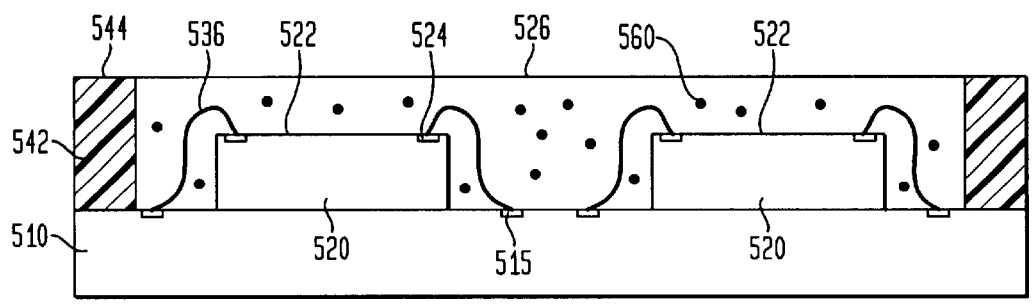
FIG. 10B shows the subassembly of FIG. 10A during a further step of the assembly process.

FIG. 10B shows the assembly after cover layer (FIG. 10A) has been removed to expose top surface 544 of dam 542 and top surface 526 of compliant layer 560. The compliant layer 560 preferably comprises a material that is at least partially transparent to light so that light may interface with the optically active surfaces of chips 520.

These and other variations and combinations of the features described above may be utilized without departing from the present invention as defined by the claims. Thus, the foregoing description of preferred embodiments should be taken by way of illustration rather than by way of limitation of the claimed invention.

What is claimed is:

1. A method of encapsulating a microelectronic assembly comprising:
   (a) providing a substrate having a top surface;
   (b) securing at least one packaged chip over the top surface of said substrate;
   (c) electrically interconnecting said at least one packaged chip and said substrate;
   (d) providing a dam over the top surface of said substrate, wherein said dam surrounds the at least one packaged chip secured to said substrate;
   (e) providing a cover layer over said dam and the at least one packaged chip secured to said substrate, wherein said substrate, said dam and said cover layer define an enclosed air-tight space surrounding the at least one packaged chip;
   (f) introducing a curable liquid encapsulant into the enclosed space; and
   (g) curing said curable liquid encapsulant.

2. The method as claimed in claim 1, further comprising drawing vacuum through a hole in said cover layer for evacuating the enclosed air-tight space prior to introducing the curable liquid encapsulant through the hole in said cover layer.

3. The method as claimed in claim 2, wherein the introducing a curable liquid encapsulant step includes providing a dispenser in communication with the enclosed space and passing said curable liquid encapsulant through said dispenser and into the enclosed space.

4. The method as claimed in claim 3, wherein the introducing the curable liquid encapsulant step occurs after the evacuation step.

5. The method as claimed in claim 3, wherein said dispenser is a needle and wherein the step of advancing said needle through the hole in said cover layer precedes the step of introducing said curable liquid encapsulant into the enclosed space.

6. The method as claimed in claim 2, wherein the evacuating step includes removing air from the enclosed space.

7. The method as claimed in claim 5, wherein said cover layer sealingly engages said needle at the hole during the step of passing said curable liquid encapsulant into the enclosed space.

8. The method as claimed in claim 1, wherein the at least one packaged chip has a porous layer and wherein the curable liquid encapsulant penetrates into the porous layer during the introducing a curable liquid encapsulant into the enclosed space step.

9. The method as claimed in claim 8, wherein said porous layer includes an array of compliant pads between a semiconductor chip a dielectric sheet.

10. The method as claimed in claim 1, wherein said at least one packaged chip includes a semiconductor chip having contacts on a contact bearing face and a back surface remote from the contact bearing face.

11. The method as claimed in claim 10, wherein the back surface of said semiconductor chip engages the top surface of said substrate so that the contact bearing face of said semiconductor chip faces away from said substrate.

12. The method as claimed in claim 10, wherein said at least one packaged chip further comprises a dielectric sheet and leads electrically interconnecting the semiconductor chip and the dielectric sheet, said dielectric sheet including a bottom surface having terminals interconnected with said leads.

13. The method as claimed in claim 10, wherein the back surface of said semiconductor chip faces away from the top surface of said substrate.

14. The method as claimed in claim 13, wherein said cover layer engages the back surface of said semiconductor chip.

15. The method as claimed in claim 13, wherein said cover layer overlies the back surface of said semiconductor chip.

16. The method as claimed in claim 15, wherein said cover layer is spaced above the back surface of said semiconductor chip, wherein the curable liquid encapsulant flows between the back surface of said semiconductor chip and said cover layer during the step of introducing the curable liquid encapsulant.

17. The method as claimed in claim 1, wherein said cover layer is thermally conductive.

18. The method as claimed in claim 1, wherein said cover layer comprises a polymer.

19. The method as claimed in claim 1, wherein said cover layer is at least partially transparent.

20. The method as claimed in claim 1, wherein said packaged chip includes a semiconductor chip.

21. The method as claimed in claim 1, wherein said packaged chip includes a dielectric sheet.

22. The method as claimed in claim 1, wherein the curable liquid encapsulant includes an elastomer.

23. The method as claimed in claim 1, wherein the curable liquid encapsulant includes a silicone elastomer.

24. The method as claimed in claim 1, wherein said cover layer comprises a thermally conductive material, and wherein a portion of said cover layer remains attached to the at least one packaged chip after the curing step for transferring heat from the at least one packaged chip.

25. The method as claimed in claim 1, wherein the curing the curable liquid encapsulant step is performed using heat or light.

26. A method of making microelectronic assemblies comprising:
   (a) securing at least one packaged chip over a substrate;
   (b) electrically interconnecting said packaged chip and said substrate;
   (c) securing a dam over said substrate, wherein said dam surrounds the at least one packaged chip secured to said substrate;
   (d) applying a cover layer over said dam and over the at least one packaged chip so as to define an enclosed air-tight space surrounding said at least one packaged chip;
   (e) introducing a curable liquid encapsulant into the enclosed space; and
   (f) curing said curable liquid encapsulant, wherein a top surface of said substrate, said dam and said cover layer retain said curable liquid encapsulant in the enclosed space during the introducing a curable liquid encapsulant step.

27. The method as claimed in claim 26, further comprising evacuating the enclosed space before the introducing a curable liquid encapsulant step.

28. The method as claimed in claim 26, wherein the curing said curable liquid encapsulant step includes exposing said encapsulant to heat or light.

29. The method as claimed in claim 26, wherein said at least one packaged chip includes a semiconductor chip mounted atop a dielectric sheet and conductive leads electrically interconnecting the semiconductor chip and the dielectric sheet, said conductive leads having terminal ends accessible at an underside of said dielectric sheet.

30. The method as claimed in claim 29, wherein said substrate includes a top surface having conductive pads the method further comprising electrically connecting the terminal ends of said conductive leads to the conductive pads of said substrate.

31. The method as claimed in claim 30, wherein said at least one packaged chip further comprises a porous layer between said semiconductor chip and said dielectric sheet.

32. The method as claimed in claim 31, said porous layer comprising a plurality of compliant pads having voids therebetween, the curable liquid encapsulant filling the voids between the compliant pads during the introducing a curable liquid encapsulant step.

33. The method as claimed in claim 26, wherein said at least one packaged chip includes a semiconductor chip having a contact bearing face and a back surface, wherein the back surface of said semiconductor chip engages said substrate.

34. The method as claimed in claim 33, wherein said substrate includes conductive pads electrically interconnected with contacts on the contact bearing face of said semiconductor chip by conductive leads.

35. A method of encapsulating microelectronic assemblies comprising:
   (a) securing one or more packaged chips over a substrate;
   (b) electrically interconnecting said one or more packaged chips and said substrate;
   (c) securing a dam over said substrate, wherein said dam surrounds the one or more packaged chips secured to said substrate;
   (d) applying a cover layer over said dam and over the one or more packaged chips so as to define an enclosed air-tight space surrounding said at least one packaged chip;
   (e) evacuating the enclosed space;
   (f) after the evacuating the enclosed space, introducing a curable liquid encapsulant into the enclosed space; and
   (g) curing said curable liquid encapsulant, wherein a top surface of said substrate, said dam and said cover layer retain said curable liquid encapsulant in the enclosed space during the introducing a curable liquid encapsulant step.

36. The method as claimed in claim 35, wherein said one or more packaged chips have back surfaces remote from said substrate and said dam has a top surface that is substantially coplanar with the back surfaces of said packaged chips.

37. The method as claimed in claim 35, wherein each said packaged chip includes a porous layer having voids, said curable liquid encapsulant flowing into the voids of said porous layers during the introducing a curable liquid encapsulant step.

* * * * *

UNITED STATES PATENT AND TRADEMARK OFFICE
CERTIFICATE OF CORRECTION

PATENT NO. : 6,602,740 B1  Page 1 of 1
DATED : August 5, 2003
INVENTOR(S) : Craig S. Mitchell It is certified that error appears in the above-identified patent and that said Letters Patent is hereby corrected as shown below:

Column 4,
Line 63, after "above" insert -- - --.

Column 8,
Line 4, delete "58".
Delete lines 24-39.
Line 59, after "assemblies," insert -- liquid encapsulant --.

Column 11,
Line 20, "446" should read -- 546 --.

Column 12,
Delete lines 1-5 and substitute therefor the following:
-- 3. The method as claimed in claim 2, wherein the introducng a curable liquid encapsulant step includes advancing a dispenser through the hole in said cover layer for providing said dispenser in communication with the enclosed air-tight space and passing said curable liquid encapsulant through said dispenser and into the enclosed air-tight space. --
Line 26, after "chip" insert -- and --.

Column 14,
Line 30, after "space" insert -- step --.

Signed and Sealed this

Tenth Day of August, 2004

JON W. DUDAS
*Acting Director of the United States Patent and Trademark Office*